United States Patent [19]

Horton et al.

[11] 3,950,843

[45] Apr. 20, 1976

[54] CONTINUOUS FILM TRANSISTOR FABRICATION PROCESS

[75] Inventors: Arthur E. Horton, Richardson; Jordan W. Brantley, Hurst; Paul R. Smith, Dallas; Cecil W. Lightfoot, Dallas; Richard L. Hanneman, Dallas, all of Tex.

[73] Assignee: Texas Instruments Incorporated, Dallas, Tex.

[22] Filed: Sept. 15, 1971

[21] Appl. No.: 180,824

Related U.S. Application Data

[62] Division of Ser. No. 887,892, Dec. 24, 1969, Pat. No. 3,843,911.

[52] U.S. Cl. ................................ 29/574; 29/588; 29/589; 29/590; 29/624
[51] Int. Cl.² .......................................... B01J 17/00
[58] Field of Search ................ 29/576 S, 589, 624, 29/626, 588, 574, 590

[56] References Cited
UNITED STATES PATENTS

| 3,248,779 | 5/1966 | Yuska | 29/626 |
| 3,374,533 | 3/1968 | Burks | 29/576 S |
| 3,440,027 | 4/1969 | Hugle | 29/576 S |

Primary Examiner—W. Tupman
Attorney, Agent, or Firm—Harold Levine; James T. Comfort; Gary C. Honeycutt

[57] ABSTRACT

A continuous film transistor fabrication process utilizes a roll of polyimide substrate film on which a plurality of groups of three metal contacts is patterned. The edges of the film are turned under, including portions of the metal contacts, to facilitate the ohmic bonding of the substrate contacts to other respective contacts on a support member. Holes are formed in the film between each pattern to act as indexing means for feeding the film through a series of processing stations. As the film passes through each station, a separate step in the fabrication takes place, until the completed, tested, and sorted transistors are removed from the last station.

16 Claims, 4 Drawing Figures

U.S. Patent   April 20, 1976   Sheet 1 of 2   3,950,843
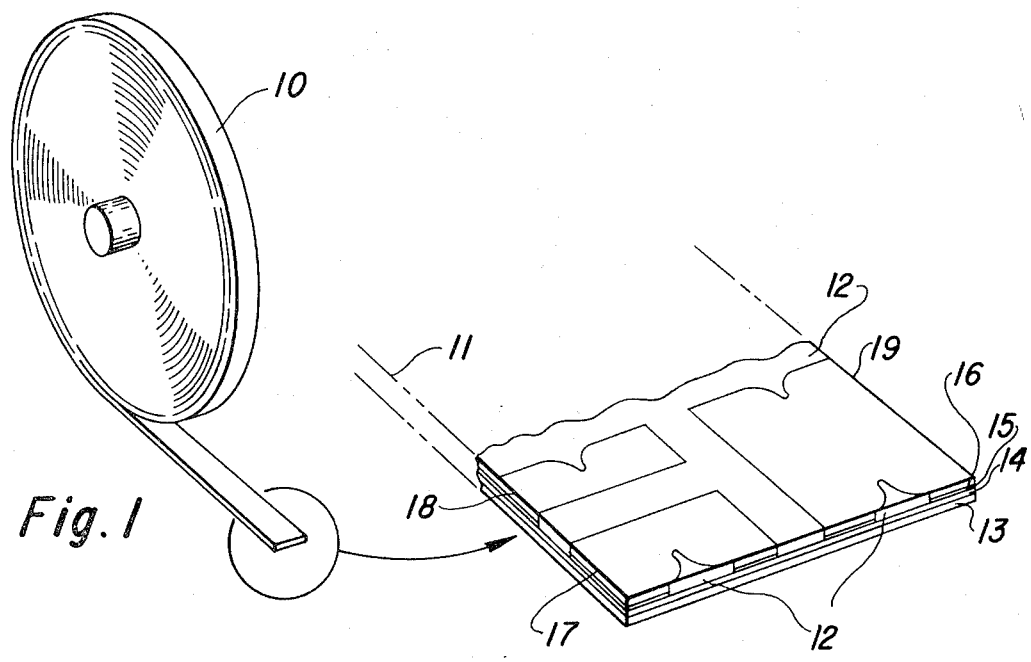
Fig. 1
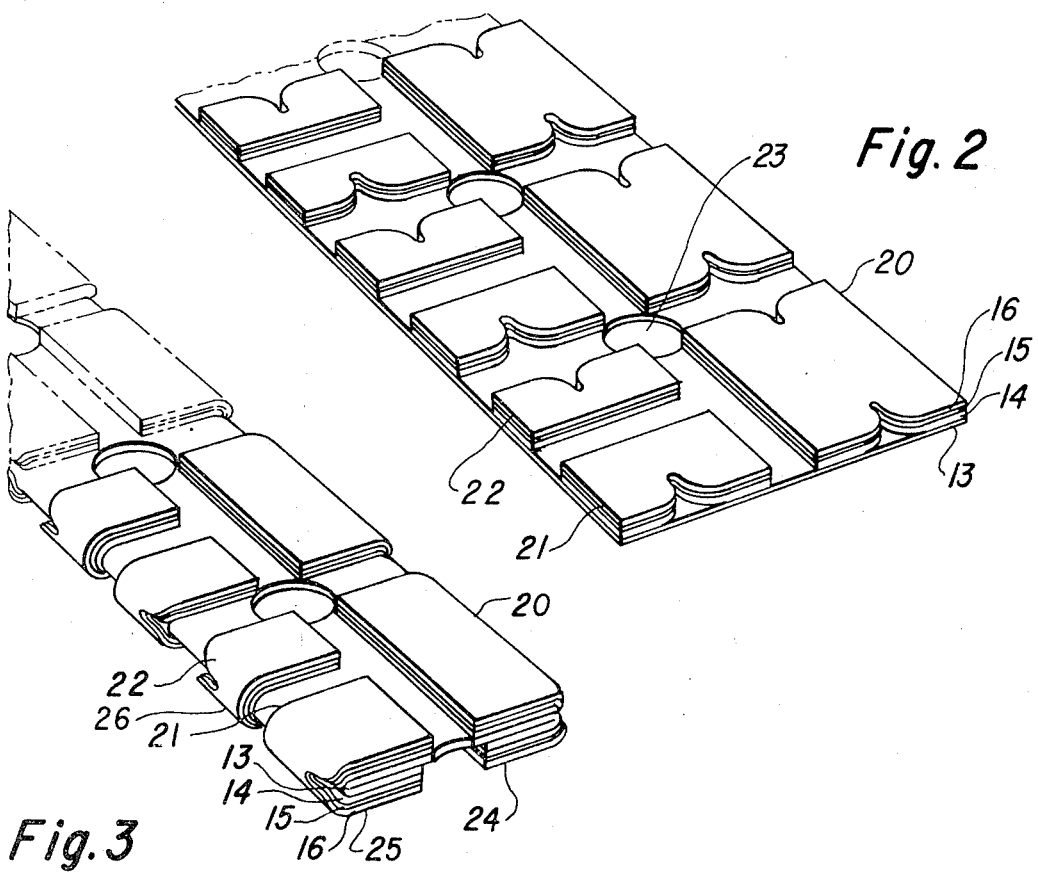
Fig. 2
Fig. 3

CONTINUOUS FILM TRANSISTOR FABRICATION PROCESS

This is a division of application Ser. No. 887,892, filed Dec. 24, 1969, and now U.S. Pat. No. 3,843,911.

This invention relates generally to automated transistor fabrication, and more particularly to a continuous process of transistor fabrication which employs an advancing roll of metal-clad polyimide film on which groups of contact patterns are formed.

In the semiconductor industry, transistor fabrication techniques are often only partially automated. A completely automated and continuous transistor fabrication process would yield a greater quantity of usable devices more economically and reliably than those methods presently employed.

It is therefore an object of the invention to provide a continuous film transistor fabrication process which is capable of total automation.

Another object of the invention is to provide a transistor manufacturing process capable of continuously fabricating transistors on inexpensive substrate film as it is fed through a series of processing stations.

A further object of the invention is to provide an improved method for forming a plurality of groups of metal contacts patterned on a continuous roll of insulating substrate film capable of the continuous fabrication of transistors therefrom.

Still another object of the invention is to provide a continuous roll of insulating substrate film with a plurality of groups of contacts formed thereon capable of ohmic bonding to both a transistor chip and the electrically conductive metal contacts of a support member.

Still a further object of the invention is to provide a continuous transistor fabrication process in which one processing station may be temporarily shut down without creating the necessity of shutting down the entire process.

A feature of the invention provides a method of testing a transistor chip and its ohmically bonded substrate connections before committing a support member to the chip and substrate.

These and other objects and features are accomplished in accordance with an embodiment of the invention by utilizing a roll of metal-clad substrate film in a continuous transistor fabrication process. The film is formed by selectively depositing a first layer of protective material and a second layer of a noble metal on the surface of a layer of copper clad to polyimide film and selectively etching the excess to remove copper, thereby patterning a plurality of three contacts (one larger and two smaller contacts) on the film. The edges of the film are then turned under to facilitate the ohmic connection of a portion of each contact to a metal contact on a support member and a hole is punched in the film between each tri-contact pattern to act as an indexing means for feeding the roll of substrate film through a series of processing stations.

At the first of such stations, a back-side collector contact transistor chip is alloyed to the larger contact of a first tri-contact pattern on the roll. When the substrate film advances to the next station, a wire is ohmically bonded between one of the active elements of the transistor and another of the three contacts of the first pattern, while another transistor chip is being alloyed to the large contact of tri-contact pattern now located at the first station.

Again the film advances, and at a third station, a second wire is ohmically bonded to a second active element of the transistor chip of the first tri-contact pattern and the third of the three contacts. Two subsequent patterns on the film are now at the first bonding station and alloying station respectively where those functions are taking place, and so on.

The film again advances and the first tri-contact patterned substrate is at a fourth station where both the transistor and bonded wires are electrically tested. As the film advances to the next station, an insulating support member including three electrically conductive metal posts or contacts joins the first tri-contact patterned substrate on the film and if the transistor is electrically operational at least one of the three contacts is ohmically connected to one of the support member's posts. The first substrate is then sliced off of the roll of film and at a next station the remaining contacts and posts of the transistor-substrate-support member combination are ohmically connected together.

The combination is then conveyed to a next station at which the ohmic welds are electrically tested and the transistors sorted according to the electrical characteristics of each. At the next station, the transistor-substrate-header combination is joined by a metal cap which is placed over the top of the support member and welded thereto after the air has been removed from the cap.

Other objects and advantages of the invention will be apparent from the detailed description and claims and from the accompanying drawings illustrative of the invention wherein:

FIG. 1 illustrates the roll of metal clad polymer film which has been patterned with a plurality of groups of three contacts to form the substrate film for the continuous transistor manufacturing process;

FIG. 2 illustrates a portion of the roll of metal clad polymer film after the mask and excess metal have been removed to form a plurality of groups of three contacts and indexing means have been formed in the polymer between each group;

Figure 4:
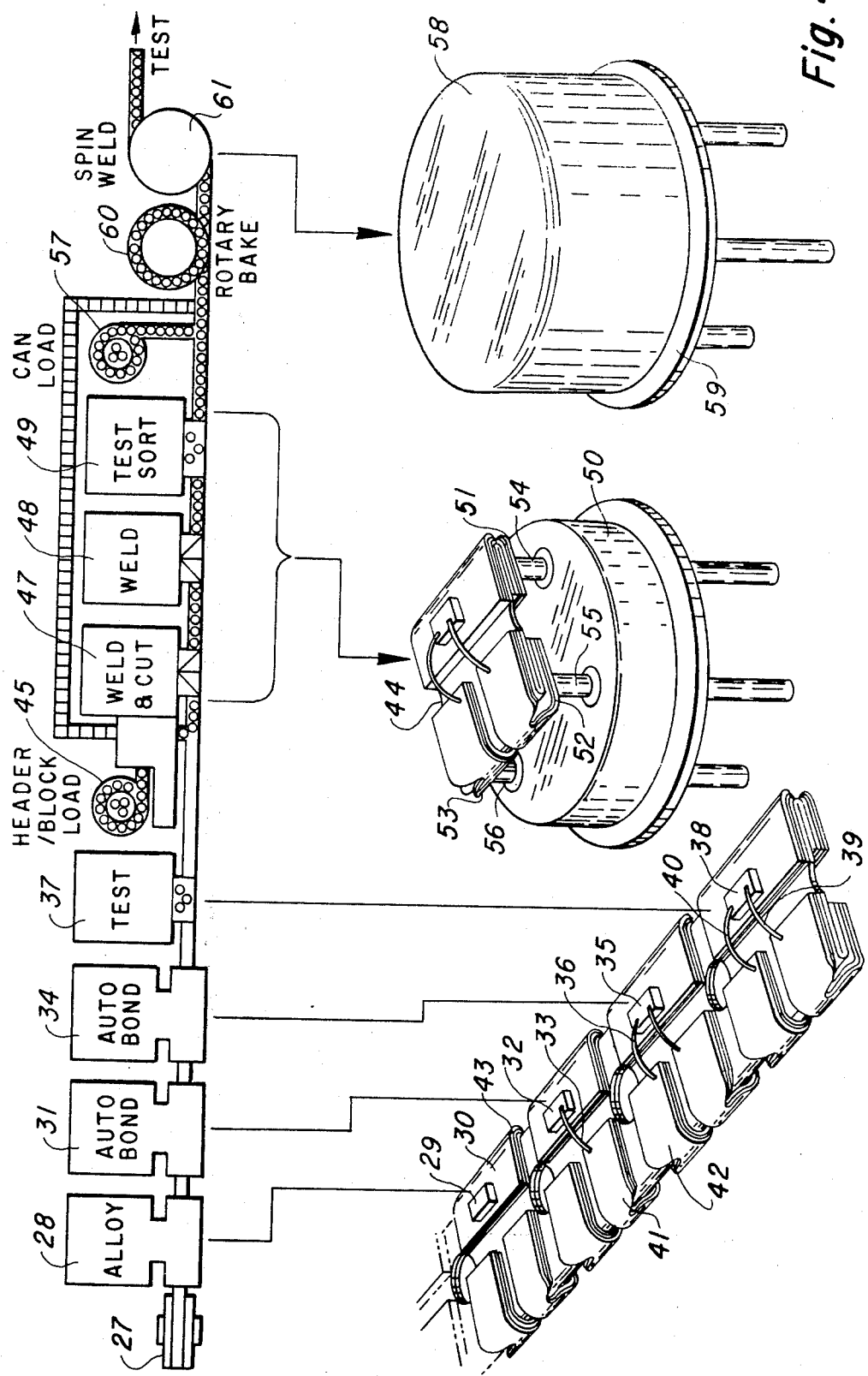

FIG. 3 illustrates a portion of the completed roll of substrate film aftr the edges have been turned under to facilitate the ohmic welding of a portion of each substrate contact to another respective contact on a support member; and FIG. 4 illustrates further steps in an embodiment of the continuous film transistor fabrication process as the roll of substrate film is fed through a series of processing stations.

The continuous film transistor fabrication process of the invention utilizes a roll of copper clad polymer film such as copper clad polyimide on which the copper is etched and other metals selectively deposited to form a plurality of groups of three electrically conductive contacts. The product of the first steps in forming the contacts on the film are illustrated in FIG. 1.

A roll 10 of polyimide film 13 with a copper layer 14 adhesivelessly bonded to one surface is provided. One such film which is commonly used in the electronics industry for various purposes is Cuflex manufactured and sold by the 3M Company. The copper layer 14 is typically 1.4 mils thick on 1 mil film 13. The film is typically rolled in widths of 160 mils for the fabrication of small transistors, while larger widths are necessary for other types of transistors such as high power transistors.

The entire copper surface is covered or coated with a photoresist such as Riston, comprised of a photosensitive material sandwiched between a sheet of mylar and a sheet of polyethylene and manufactured by the Dupont Company. The photoresist is then exposed to light of approximately 3500 angstroms through a mask, forming a plurality of groups of three contact shapes patterned in the unexposed photoresist. One such group of contacts 17, 18 and 19 is shown in the figure. The photoresist is then removed from the unexposed areas where the contacts 17, 18 and 19 are formed by etching with chloruthene to expose the underlying surface of copper layer 14, leaving the exposed photoresist remaining only in those areas 12 where no contact is to be formed. Layer 15 of a protective material is then deposited on the exposed copper surface by plating, to prevent the copper from migrating through to top layer 16 of a noble metal which is henceforth deposited on the nickel layer. The protective material which is nickel, chromium or molybdenum is deposited by plating to a thickness of 0.1 mil while the layer of noble metal (gold, silver or platinum) is deposited by plating to a thickness of 0.06 mil.

Once the metal plating is complete, the remaining photoresist material is removed by washing with an alkaline stripper or trichloroethylene and those portions of copper layer 14 under the remaining photoresist 12 are removed by etching with a solution of ferric chloride, ammonium persulphate or chromic sulphuric acid. Since neither the wash nor the etchant react with the noble metal layer plated on the contacts, the noble metal acts as a mask for the washing and etching steps. The resulting structure is a polyimide film, with groups of three contacts adherently patterned on one surface thereof, coiled into a roll. A portion of the structure is illustrated in FIG. 2. One contact 20 of each group is typically larger than the other two (21 and 22) so that a back-side collector contact transistor chip may be alloyed directly to larger contact 20. For a small transistor the larger contact (20) is typically 76 by 100 mils while the two smaller contact (21 and 22) are typically 76 and 41 mils. For other types of transistors such as power transistors, the contacts are considerably larger. In addition, holes 23 (31 mils in diameter) are punched in the polyimide film (13) between each group of contacts to act as indexing means for feeding the substrate film through a series of processing stations.

The edges of the substrate film are then turned under, as illustrated in FIG. 3, so that each contact 20, 21 and 22 extends on both the upper and the lower portions of the surface of the substrate film to facilitate the welding or ohmic connection of external contacts on a support member to under portions 24, 25 and 26 of the substrate contacts.

Roll 27 of the substrate film (95 mils wide) is now ready to be fed through a series of processing stations, as illustrated by one embodiment of the invention in FIG. 4. As the film is advancing through the first of such stations 28, a back-side collector contact transistor chip 29 is alloyed to the larger contact 30 of each tri-contact pattern on the roll. The alloying takes place in a closed space filled with nitrogen at a temperature of 440°–470°C. and 15–25 grams of weight on each chip. At that temperature and pressure a eutectic is formed between noble metal layer 43 of large contact 30 and a metal layer (typically gold) on the back-side of transistor chip 29. As the substrate film advances through a next station 31, a gold wire 33 is aligned and thermocompression ball bonded (at 300°–330°C.) to one of the other two regions (base or emitter) of transistor chip 32 and a second of the three contacts 41 in the particular group on the substrate film, while concurrently at station 28 another transistor chip is being alloyed to the large contact of a tri-contact pattern being fed through it as described above. Some slack in the film is allowed between stations to avoid excessive stress in the film and to provide storage capability so that if one of the processing stations is temporarily shut down, it will not be necessary to shut down the entire process. As the film advances through a third station 31, a second wire 36 is ohmically bonded between the remaining active element of the transistor chip 35 and the third of the three contacts 42. Two subsequent patterns on the film are now at the first bonding station 31 and alloying station 28 respectively where those functions are taking place and so on.

As the film again advances a tri-contact pattern with chip 38 and both bonded wires 39 and 40 is at a fourth station 37 where transistor chip 38 is electrically tested to determine its electrical characteristics, and bonded wires 39 and 40 are tested for continuity.

The transistor chip-substrate combinations 44 are used as is, or if desired, one or more of the electrically good combinations are ohmically connected to other external contacts on a support member. The support member such as an insulating header 50 (typically of 95% ceramic alumina) having three electrically conductive metal (typically an alloy comprised of about 30% nickel, 50% iron and 20% cobalt) posts or contacts 54, 55 and 56 is loaded into the process at station 45. Those transistor chip-substrate combinations which are not electrically good are rejected from the process, and only the good combinations are committed to headers.

Thus, at a next station 47, at least one of the three contacts (51, 52 and 53) of those combinations 44 which are electrically operable is ohmically connected or welded to a respective conductive post (54, 55 or 56) of insulating header 50. The welder is of the resistance type comprised of a class 2 electrode on the metal alloy header posts and a class 10 electrode on the substrate contacts. The welding takes place under a pressure of approximately 24 ounces at 0.8–1.0 watt-seconds for single post connection and at 1.2–1.8 watt-seconds for double post connection.

Alternately, the substrate contacts may be ohmically connected to the header posts by crimping or soldering instead of welding.

After at least one of the contacts has been welded, the combination has sufficient rigidity to be sliced or severed from the roll. This slicing operation may take place at the same station.

At a next station 48 the remaining contacts (51, 52 or 53) of the substrate 44, if any, are ohmically welded to their respective contacts (54, 55 or 56) on insulating header 50 in the same manner described above.

The transistor-substrate-header combinations are then conveyed to the next processing station 49 at which the ohmic welds are electrically tested and the transistors sorted according to the electrical characteristics of each.

At the next station 57, the transistor-substrate-header combinations are joined by metal caps 58 which are placed over the top of each of the headers 59. The transistors are then baked at 100°–150°C. to remove any moisture inside of cap 58 at station 60. In a preferred embodiment the baking operation would take place in a rotary baker comprised of a rotary member into which the capped headers are inserted. The capped headers then ride around in the rotary member for a time sufficient for the moisture to be removed, and are ejected at the end of the rotation cycle moisture free.

The caps are then inertially welded to the headers at station 61 thereby completing the continuous transistor fabrication process of an embodiment of the invention.

The transistor is then retested, if desired, to make sure that no damage has occurred during the baking and cap-welding operations.

The description of specific embodiments contained herein are merely illustrative of the principles underlying the inventive concept. Various modifications of the disclosed embodiments, as well as other embodiments of the invention, will be apparent to persons skilled in the art.

What is claimed is:

1. A continuous film transistor fabrication process comprising the steps of:
   a. forming a plurality of groups of electrically conductive contacts adherently patterned on one surface of a polymer film coiled into a roll thereby forming a continuous roll of substrate film;
   b. turning the edges of said substrate film under so that a portion of each contact extends on both the upper and the lower portions of said one surface of the substrate film to facilitate the ohmic connection of a portion of each contact to a metal contact on a support member; and
   c. forming a hole in the polymer film between each contact pattern as an indexing means for continuously feeding the roll of substrate film through a series of processing stations.

2. A continuous film transistor fabrication process comprising the steps of:
   a. forming a plurality of groups of three electrically conductive contacts adherently patterned on one surface of a polymer film coiled into a roll thereby forming a continuous roll of substrate film;
   b. turning the edges of said substrate film under so that a portion of each contact extends on both the upper and the lower portions of said one surface of the substrate film to facilitate the ohmic connection of a portion of each contact to a metal contact on a support member; and
   c. forming a hole in the polymer film between each tri-contact pattern as an indexing means for continuously feeding the roll of substrate film through a series of processing stations.

3. The continuous film transistor fabrication process of claim 2, wherein the polymer film is comprised of a polyimide.

4. The continuous film transistor fabrication process of claim 2, wherein the support member is a transistor header.

5. The continuous film transistor fabrication of claim 2, wherein the support member is a circuit board.

6. The continuous film transistor fabrication process of claim 2, wherein the plurality of groups of three electrically conductive contacts patterned on said one surface of said polymer film coiled into a roll are formed by:
   a. providing a roll of polymer film with a copper layer bonded to said one surface;
   b. selectively depositing a first layer of protective material and a second layer of a noble metal on the copper layer to form said tri-contact patterns; and
   c. removing the copper from those areas where no contacts are formed.

7. The continuous film transistor fabrication process of claim 6, wherein the first layer of protective material is nickel.

8. The continuous film transistor fabrication process of claim 6, wherein the first layer of protective material is molybdenum.

9. The continuous film transistor fabrication process of claim 6, wherein the first layer of protective material is chromium.

10. The continuous film transistor fabrication process of claim 6, wherein the second layer of noble metal is silver.

11. The continuous film transistor fabrication process of claim 6, wherein the second layer of noble metal is gold.

12. The continuous film transistor fabrication process of claim 6, wherein the second layer of noble metal is platinum.

13. The continuous film transistor fabrication process of claim 2, wherein the plurality of groups of three electrically conductive contacts patterned on said one surface of polymer film coiled into a roll are formed by:
   a. providing a roll of polymer film with a copper layer bonded to said one surface;
   b. coating the entire copper surface with a photoresist;
   c. exposing the photoresist to light through a mask to form a plurality of tri-contact patterns in the photoresist;
   d. etching away the photoresist to expose the surface of the copper where each contact is to be formed;
   e. depositing a layer of protective material on said exposed portion of the copper surface;
   f. depositing a layer of a noble metal on said layer of protective material; and
   g. removing the remaining photoresist and copper underlying said remaining photoresist material with an etchant which does not react with the noble metal.

14. The continuous film transistor fabrication process of claim 2, including a further step of continuously feeding the roll of substrate film through a series of processing stations.

15. The continuous film transistor fabrication process of claim 14, wherein said processing stations include the steps of:
   a. providing a transistor chip having a back-side collector contact and two other contacts to base and emitter active regions;
   b. alloying the collector contact of said transistor chip to one substrate contact of each tri-contact pattern on the roll;
   c. ohmically bonding a first wire to one of said other active region contacts and a second substrate contact of each of said patterns on the roll; and
   d. ohmically bonding a second wire to the remaining active region contacts and the remaining contact of each pattern on the roll.

16. The continuous film transistor fabrication process of claim 15, wherein said processing stations further include the steps of:
   a. testing said transistor chips and said substrate contact bond to determine the electrical characteristics of said transistor chips and the electrical continuity of the contact bonds;
b. providing insulating transistor headers including three electrically conductive metal posts;
c. ohmically bonding the metal posts of said headers to respective ones of the three contacts of each pattern on said substrate film on which the alloyed transistor chip is electrically operational;
d. severing the substrate film to separate each tri-contact pattern;
e. providing metal cans to cover and protect the transistor;
f. removing any moisture inside said cans; and
g. bonding said cans to said headers.

* * * * *